United States Patent
Xu et al.

(10) Patent No.: US 11,968,886 B2
(45) Date of Patent: Apr. 23, 2024

(54) PREPARATION METHOD OF PEROVSKITE FILM BASED ON SEM-HCl ADDITIVE AND OF PHOTOVOLTAIC DEVICE

(71) Applicant: Nanjing University of Posts & Telecommunications, Nanjing (CN)

(72) Inventors: Ligang Xu, Nanjing (CN); Wenbo Jia, Suqian (CN); Dongdong Yan, Nanjing (CN)

(73) Assignee: NANJING UNIVERSITY OF POSTS & TELECOMMUNICATIONS, Nanjing (CN)

(*) Notice: Subject to any disclaimer, the term of this patent is extended or adjusted under 35 U.S.C. 154(b) by 0 days.

(21) Appl. No.: 18/469,581

(22) Filed: Sep. 19, 2023

(65) Prior Publication Data

US 2024/0099126 A1    Mar. 21, 2024

(30) Foreign Application Priority Data

Sep. 19, 2022  (CN) .......................... 202211140626.3

(51) Int. Cl.
*H10K 85/50*  (2023.01)
*H10K 30/10*  (2023.01)
*H10K 30/50*  (2023.01)
*H10K 30/86*  (2023.01)
*H10K 71/12*  (2023.01)

(52) U.S. Cl.
CPC ............ *H10K 85/50* (2023.02); *H10K 30/10* (2023.02); *H10K 30/50* (2023.02); *H10K 30/86* (2023.02); *H10K 71/12* (2023.02)

(58) Field of Classification Search
None
See application file for complete search history.

(56) References Cited

U.S. PATENT DOCUMENTS

2020/0361968 A1* 11/2020 Hayase .................. H10K 30/80

OTHER PUBLICATIONS

Zhang Meili, "Study on Assembly and Performance Optimization of New Thin Film Solar Cells", "China Excellent Master's Dissertation Full-text Database Engineering Technology I Series", Issue 02th, 2022, published in Jan. 16, 2022-Feb. 15, 2022, pp. B020-B625.

Minghao Wang et al. "Suppression of Sn2+ oxidation and formation of large-size crystal grains with multifunctional chloride salt for perovskite solar cell applications", "Journal of Materials Chemistry C", issue 10th, issue 2th, 2022, pp. 10669-10678.

(Continued)

*Primary Examiner* — Eli S Mekhlin
(74) *Attorney, Agent, or Firm* — Zhigang Ma

(57) ABSTRACT

A preparation method of perovskite film based on semicarbazide hydrochloride (SEM-HCl) additive and a preparation method of photovoltaic device are provided, a perovskite optimized crystallization strategy is provided, a tin-based perovskite thin film is prepared based on a solution method, and a purpose of regulating and controlling perovskite crystallization is achieved by means of a cross-linking effect of special groups in SEM-HCl and perovskite components. Defects of crystals of the prepared perovskite film are reduced, the non-radiative recombination in a transmission process of carriers is suppressed, and a photoelectric conversion efficiency and a photovoltaic device stability are remarkably improved.

2 Claims, 5 Drawing Sheets

(56) References Cited

OTHER PUBLICATIONS

CNIPA, Notification of a First Office Action for CN202211140626.3, dated Apr. 17, 2023.
Nanjing University of Posts and Telecommunications (Applicant), Reply to Notification of a First Office Action for CN202211140626.3, w/ replacement claims, dated Jun. 16, 2023.
Nanjing University of Posts and Telecommunications (Applicant), Supplemental Reply to Notification of a First Office Action for CN202211140626.3, w/ (allowed) replacement claims, dated Jun. 26, 2023.
CNIPA, Notification to grant patent right for invention in CN202211140626.3, dated Jun. 29, 2023.

* cited by examiner

PREPARATION METHOD OF PEROVSKITE FILM BASED ON SEM-HCl ADDITIVE AND OF PHOTOVOLTAIC DEVICE

TECHNICAL FIELD

The disclosure relates to the technical field of solar cells, and more particularly to a preparation method of a perovskite film based on semicarbazide hydrochloride (SEM-HCl) additive and a preparation method of photovoltaic device.

BACKGROUND

Organic-inorganic hybrid metal halide perovskite solar cells (PSCs) have advantages such as a low-cost fabrication and a high efficiency, a power conversion efficiency (PCE) of the PSCs is improved from 3.8 percent (%) to 26.1% in recent years, and the PCE of the PSCs is already very close to the highest PCE of monocrystalline silicon solar cells. Tin-based perovskites have received great attentions in recent years due to their excellent photoelectric properties and environmentally friendly characteristics. However, there are still significant challenges in preparing tin-based perovskite solar cells with high efficiency and stability due to poor crystal quality and easy oxidation of divalent tin ion ($Sn^{2+}$).

Inverted (p-i-n structure) perovskite solar cells have attracted great attention from people due to their advantages of easy to manufacture and flexibility. Besides, solution methods for preparing perovskite films have advantages of simple operation and high repeatability. However, in a process of preparing a perovskite film using the solution method, adverse phenomena such as segregation and non-dense film will be caused by defects due to fast crystallization of tin perovskites or interface contact problems between different charge transport layers. Charge carriers are captured by a defect state energy level caused by the above defects, resulting in non-radiative recombination. Energy generated by electron-hole pair recombination is transferred to surrounding crystal lattices in a form of heat, which generates a decrease in an open circuit voltage ($V_{OC}$), a fill factor (FF), and a short circuit current density ($J_{SC}$) of a solar cell, ultimately leads to poor device efficiency and stability.

Regulation of perovskite crystallization process is one of the most effective ways to obtain a high-quality perovskite thin film. Additive engineering has been proven to be one of the effective methods for obtaining the high-quality perovskite film. For an additive engineering process, some materials with certain functional elements or special structures are added into the perovskite precursor. Additives have different effects on perovskite due to their chemical structures. Some functional groups (amide (—NH), and amino (—$NH_2$)) in the additives can perform a chemical interaction with tin iodide ($SnI_2$), formamidinium iodide (FAI) or methylammonium iodide (MAI), which can optimize perovskite crystallization for the high-quality film. The additives containing the functional groups such as carbonyls can be a crosslinking agent between adjacent grains to improve quality and stability of the perovskite film. However, most additives can only have the effect on reducing $Sn^{2+}$ oxidation, which is limited for the optimization. This additive can only partially reduce shallow level trap defects, but has little optimization effect on deep level trap defects and self-undercoordinated $Sn^{2+}$ in perovskite lattices. Thus, it is crucial to design a suitable multifunctional additive, which could achieve optimization for the deep level trap defects and self-undercoordinated $Sn^{2+}$ of the tin-based perovskite.

SUMMARY

A purpose of this section is to outline some aspects of embodiments of the disclosure and briefly introduce some embodiments. Some simplification or omission may be made in this section, as well as in the abstract of the specification and the title of the disclosure, to avoid blurring the purpose of this section, abstract of the specification, and the title of the disclosure, and such simplification or omission cannot be used to limit a scope of the disclosure.

In view of the above existing problems in the related art, the disclosure is proposed.

Therefore, a first purpose of the disclosure is to overcome disadvantages of the related art, and provide a preparation method of a perovskite film based on semicarbazide hydrochloride (SEM-HCl) additive.

In order to solve the above technical problems, the disclosure provides the following technical solutions. The technical solutions include: spin coating a perovskite solution based on SEM-HCl additive on a hole transport layer, adding an anti-solvent dropwise during the spin coating to obtain a film, placing the film on a hot stage, and performing an annealing treatment on the film to obtain the perovskite film.

In an embodiment, a doping concentration of the SEM-HCl of the perovskite solution is in a range of 1-5 moles percent (mol %).

In an embodiment, the perovskite solution is a mixed solution of a SEM-HCl solution and a tin-based perovskite precursor solution.

In an embodiment, the SEM-HCl solution is a solution of a SEM-HCl solid dissolved in a N, N-dimethylformamide solution, and a concentration of the SEM-HCl is 5.58 milligrams per milliliter (mg/mL).

In an embodiment, the tin-based perovskite precursor solution is a mixed solution of perovskite materials dissolved in a mixed solution of N, N-dimethylformamide and dimethyl sulfoxide, and the perovskite materials include tin iodide ($SnI_2$), formamidinium iodide (FAI), methylammonium iodide (MAI) and tin fluoride ($SnF_2$).

In an embodiment, a volume ratio of the N, N-dimethylformamide and dimethyl sulfoxide is 4:1, and a molar ratio of $SnI_2$:FAI:MAI:$SnF_2$ is 1:0.75:0.25:0.1.

In an embodiment, a reaction temperature of the annealing treatment is in a range of 60-80 degree Celsius (° C.), and a reaction period of the annealing treatment is in a range of 5-15 minutes (min).

A second purpose of the disclosure is to overcome the disadvantages of the related art, and provide a preparation method of a photovoltaic device containing the perovskite film based on SEM-HCl additive.

In order to solve the above technical problems, the disclosure provides the following technical solutions. The technical solutions include: preparing a first electrode layer on a substrate layer, preparing a first transport layer on the first electrode layer, preparing a photoactive layer based on SEM-HCl additive on the first transport layer by using a low temperature solution annealing process, preparing a second transport layer on the photoactive layer, preparing a barrier layer on the second transport layer, and preparing a second electrode layer on the barrier layer.

Specifically, the first electrode layer is a metal oxide anode layer, the first transport layer is a hole transport layer, the photoactive layer is a perovskite film, the second transport layer is an electron transport layer, the barrier layer is a hole barrier layer, and the second electrode layer is a metal cathode layer.

A third purpose of the disclosure is to overcome the disadvantages of the related art, and provide a photovoltaic device containing the perovskite film based on SEM-HCl additive.

In an embodiment, the photovoltaic device includes a substrate layer, a metal oxide anode layer, a hole transport layer, a perovskite film, an electron transport layer, a hole barrier layer and a metal cathode layer.

Specifically, a material of the substrate is transparent glass, a material of the metal oxide anode layer is indium tin oxide (ITO) or fluoride-doped tin oxide (FTO), a material of the hole transport layer is a positive-type (p-type) organic semiconductor material, a material of the perovskite film is formamidinium methylammonium tin iodide ($FA_{0.75}MA_{0.25}SnI_3$), a material of the electron transport layer is a negative-type (n-type) material, a material of the hole barrier layer is bathocuproine ($C_{26}H_{20}N_2$), and a material of the metal cathode layer is a high conductivity metal material.

In an embodiment, the p-type organic semiconductor material includes at least one selected from the group consisting of poly[bis(4-phenyl)(2,4,6-trimethylphenyl) amine] (($C_{21}H_{19}N$)n), and poly(3,4-ethylenedioxythiophene)-poly styrenesulfonate (($C_8H_8O_3S$)x:($C_6H_6O_2S$)y); the n-type organic semiconductor material includes at least one selected from the group consisting of [6,6]-phenyl-$C_{61}$-butyric acid methyl ester ($C_{72}H_{14}O_2$), [6,6]-phenyl-$C_{71}$-butyric acid methyl ester ($C_{82}H_{14}O_2$), bathocuproine, and fullerene-$C_{60}$; and the high conductivity metal material includes at least one selected from the group consisting of gold (Au), sliver (Ag) and aluminium (Al).

Beneficial effects of the disclosure are as follows.
1. A perovskite crystallization regulation strategy for preparing a perovskite thin film by doping the SEM-HCl proposed by the disclosure can avoid a problem of many pores and defects formed in the tin-based perovskite due to rapid crystallization, an effective passivation effect is achieved for a tin-based perovskite thin film by a strong coordination group of an additive molecular, effective inhibitory effects of a deep level defect of the perovskite film and self-undercoordinated divalent tin ion ($Sn^{2+}$) of a tin-based perovskite thin film are achieved, and a high quality tin-based perovskite thin film with uniform thickness, low roughness, and few defects can be prepared.
2. The dopant material SEM-HCl used in the disclosure is a multifunctional additive material, amino (—$NH_2$) and amide (—NH) groups can coordinate with $SnI_2$ to form intermediate states, carbonyl groups can be a crosslinking agent between adjacent grains to optimize crystal growth, a weak acidic environment provided by hydrochloride salts is beneficial for improving a thermal stability of $Sn^{2+}$, multiple optimization purposes can be achieved by using a single additive, and a complexity of the preparation process is avoided.
3. A contact quality of the perovskite film and the electron transport layer in the photovoltaic device prepared by the disclosure is improved, and an extraction efficiency of carriers is increased. Compared to standard devices prepared by the related art, a photoelectric conversion efficiency (PCE) and stability are significantly improved based on the solar cell prepared by the disclosure.
4. The perovskite crystallization regulation strategy adopted by the disclosure does not need to use an additional utensil or equipment, and the process is simple and economical, the perovskite crystallization regulation strategy can achieve a preparation of large area and flexible perovskite films, which helps to promote diversity and commercial application of the perovskite photovoltaic device.

BRIEF DESCRIPTION OF DRAWINGS

In order to provide a clearer explanation of technical solutions in embodiments of the disclosure, drawings required in descriptions of the embodiments will be simply introduced below. Obviously, drawings in the following descriptions are merely some embodiments of the disclosure, for those skilled in the art, other drawings can be obtained according to the drawings without a need for creative labor.

DETAILED DESCRIPTION OF EMBODIMENTS

In order to make the above purposes, features and advantages of the disclosure more apparent and understandable, specific implementations of the disclosure will be described in details in conjunction with embodiments of the specification.

Many specific details are described in the following description to facilitate a thorough understanding of the disclosure; however, the disclosure can be also implemented in other methods different from the methods described here, those skilled in the art can make similar promotions without violating a connotation of the disclosure, therefore the disclosure is not limited by the embodiments disclosed below.

Specifically, terms "one embodiment" or "embodiment" referred to here refer to a specific feature, structure, or characteristic that can be included in at least one implementation of the disclosure. A term "in an embodiment" appearing in different parts of this specification does not necessarily refer to a same embodiment, nor is it a separate or selective embodiment that is mutually exclusive with other embodiments.

Raw materials involved in the disclosure are all commercially available without a special instruction.

Full names and abbreviations of chemical substances involved in the disclosure are shown in Table 1.

TABLE 1

Full names and abbreviations corresponding to chemical substances

| Abbreviation | Full name |
|---|---|
| PEDOT:PSS | Poly(3,4-ethylenedioxythiophene)-poly styrenesulfonate |
| $SnI_2$ | Tin iodide and |
| MAI | Formamidinium iodide |
| FAI | Methylammonium iodide |
| $SnF_2$ | Tin fluoride |
| CB | Chlorobenzene |
| SEM-HCl | Semicarbazide hydrochloride |
| $C_{60}$ | Fullerene-$C_{60}$ |
| BCP | Bathocuproine |
| Al | Aluminium |

Embodiment 1

Figure 1:
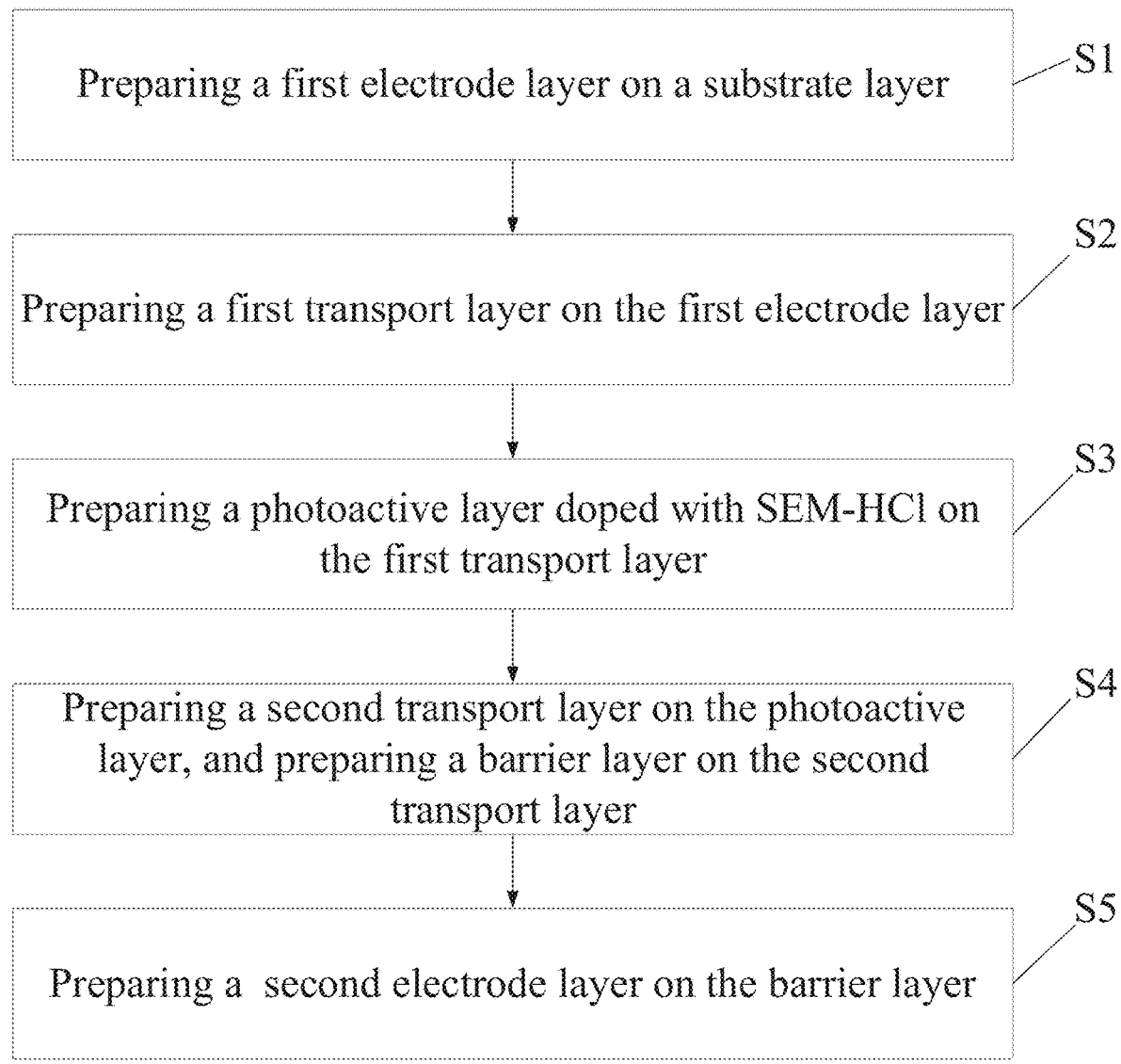
FIG. 1 illustrates a flowchart of a preparation method of a photovoltaic device in an embodiment 1 of the disclosure.
Figure 2:
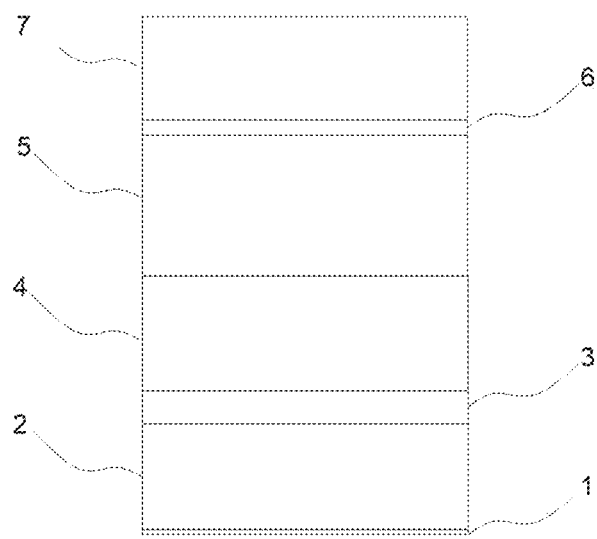
FIG. 2 illustrates a schematic structural diagram of the photovoltaic device prepared in the embodiment 1 of the disclosure.

Refer to FIGS. 1 and 2, a preparation process and a structure of a photovoltaic device in the disclosure are respectively shown in FIGS. 1 and 2, the embodiment provides a preparation method of the photovoltaic device including a perovskite film based on SEM-HCl additive, and the method includes the following steps S1-S5.

In step S1, a transparent glass is used as a substrate layer, and a first electrode layer is prepared on the substrate layer.

In an embodiment, the first electrode layer is a mental oxide anode layer, and a material of the first electrode layer is indium tin oxide (ITO).

An ultrasonic cleaning treatment is performed on an ITO conducting glass by using an ITO wash solution, deionized water, acetone, and ethanol, sequentially to obtain the cleaned ITO conducting glass; the cleaned ITO conducting glass is dried in a baking oven with a temperature of 100 degree Celsius (° C.) for 10 minutes (min) to obtain the dried ITO conducting glass, and the dried ITO conducting glass is washed by ultraviolet (UV) ozone for 15 min to obtain the first electrode layer.

In step S2, a first transport layer is prepared on the first electrode layer.

In an embodiment, the first transport layer is a hole transport layer, a material of the first transport layer is a positive-type (p-type) organic semiconductor material, and the p-type organic semiconductor material is poly(3,4-ethylenedioxythiophene)-poly styrenesulfonate (PEDOT:PSS).

A spin coater is used to spin coat a PEDOT:PSS solution on the ITO conducting glass (i.e., the first electrode layer) with a speed of 4000 revolutions per minute (rpm) for 45 seconds (s), and the ITO conducting glass coated with the PEDOT:PSS solution is dried in the baking oven at a temperature of 120° C. for 20 min after completing the spin coating, to thereby obtain the first transport layer.

In step S3, a photoactive layer based on SEM-HCl additive is prepared on the first transport layer.

In an embodiment, the photoactive layer is a perovskite film based on SEM-HCl additive, a material of the photoactive layer is formamidinium methylammonium tin iodide ($FA_{0.75}MA_{0.25}SnI_3$).

Tin iodide ($SnI_2$), formamidinium iodide (FAI), methylammonium iodide (MAI) and tin fluoride ($SnF_2$) are dissolved according to a molar ratio of 1:0.75:0.25:0.1, in a mixed solution of N, N-dimethylformamide (DMF) and dimethyl sulfoxide (DMSO) to obtain a perovskite precursor solution with a concentration of 1 mole per liter (M), and a volume ratio of the DMF and the DMSO is 4:1. 5.58 milligrams (mg) of SEM-HCl solid powder is dissolved in 1 milliliter (mL) of a DMF solvent to obtain a SEM-HCl solution with a concentration of 5.58 milligrams per milliliter (mg/mL). 12 microliters (L) of the SEM-HCl solution is added to 200 μL of the perovskite precursor solution to prepare a perovskite solution with a doping concentration of 3 moles percent (mol %), and the perovskite solution is stirred for 2 hours (h) to use.

The perovskite solution is spin coated on the first transport layer with a speed of 5000 rpm for 36 s, and an anti-solvent chlorobenzene (CB) is added when the spin coating is performed for 12 s to promote a rapid nucleation of the perovskite of the perovskite solution and attach well to a substrate (i.e., first transport layer), to thereby obtain a perovskite thin film based on the SEM-HCl additive (i.e., the perovskite thin film based on the SEM-HCl additive is formed on the first transport layer).

In an embodiment, the perovskite thin film based on the SEM-HCl additive is placed on a hot stage with a temperature of 70° C. to perform an annealing treatment for 10 min (e.g., the perovskite thin film and the first transport layer are together placed on the hot stage to perform an annealing treatment on the perovskite thin film), to thereby obtain the perovskite film (i.e., the perovskite film is formed on the first transport layer).

In step S4, a second transport layer and a barrier layer are sequentially prepared on the photoactive layer.

In an embodiment, the second transport layer is an electron transport layer, and a material of the second transport layer is fullerene-$C_{60}$ ($C_{60}$); and the barrier layer is a hole barrier layer, and a material of the barrier layer is bathocuproine (BCP).

The electron transport layer is prepared by using a vacuum evaporation plating device to evaporate $C_{60}$ on the perovskite film, and an evaporation rate for evaporating $C_{60}$ is 0.6 angstrom per hertz (Å/Hz); the hole barrier layer is prepared by evaporating BCP on the electron transport layer, a evaporation rate for evaporating BCP is 0.08 Å/Hz, an air pressure environment is ensure to be less than $5\times10^{-4}$ pascals (Pa) during the evaporation plating process, and the electron transport layer and the barrier layer are prepared after completing the evaporation plating process.

In step S5, a second electrode layer is prepared on the barrier layer.

In an embodiment, the second electrode layer is a metal cathode layer, and a material of the second electrode layer is metal aluminium (Al).

The metal cathode layer is prepared by using the vacuum evaporation plating device to evaporate the metal Al on the hole barrier layer, a evaporation rate for evaporating the metal Al is 10 Å/Hz, and the air pressure environment is ensure to be less than $5\times10^{-4}$ Pa during the evaporation plating process.

For the above prepared photovoltaic device, a thickness of the substrate layer is in a range of 1-2 millimeters (mm), a thickness of the metal oxide anode layer is in a range of 80-110 nanometers (nm), a thickness of the hole transport layer is in a range of 15-30 nm, a thickness of the perovskite film is in a range of 150-250 nm, a thickness of the electron transport layer is in a range of 400-600 nm, and a thickness of the metal cathode layer is in a range of 80-120 nm.

Embodiment 2

Refer to FIGS. 3-10, in order to verify beneficial effects of the disclosure, the embodiment provides a preparation method of a photovoltaic device using a perovskite film without doping SEM-HCl, and a photovoltaic device prepared in the embodiment 2 is compared to the photovoltaic device prepared in the embodiment 1, experimental results are compared through scientific argumentation to verify a true effect of the method of the embodiment 1.

Differences between the embodiment 2 and the embodiment 1 are as follows.

In step S3, a photoactive layer without doping SEM-HCl is prepared on the first transport layer.

In an embodiment, the photoactive layer is a perovskite film, a material of the photoactive layer is formamidinium methylammonium tin iodide ($FA_{0.75}MA_{0.25}SnI_3$).

$SnI_2$, FAI, MAI and $SnF_2$ are dissolved according to a molar ratio of 1:0.75:0.25:0.1, in the mixed solution of DMF and DMSO to obtain a perovskite precursor solution with a concentration of 1 M, and the volume ratio of the DMF and the DMSO is 4:1. The perovskite precursor solution is spin coated on the first transport layer with a speed of 5000 rpm for 36 s, and the anti-solvent CB is added when the spin coating is performed for 12 s to promote a rapid nucleation of the perovskite and attach well to the substrate, to thereby obtain a perovskite thin film.

In an embodiment, the perovskite thin film is placed in the hot stage with a temperature of 70° C. to perform an annealing treatment for 10 min, to thereby obtain the perovskite film.

Other steps and preparation process are the same as that of the embodiment 1.

Figure 3:
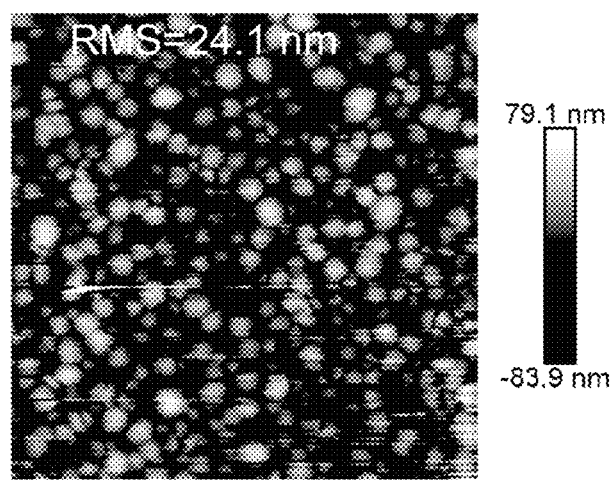
FIG. 3 illustrates an atomic force microscope diagram of a perovskite film in the embodiment 1 of the disclosure.
Figure 4:
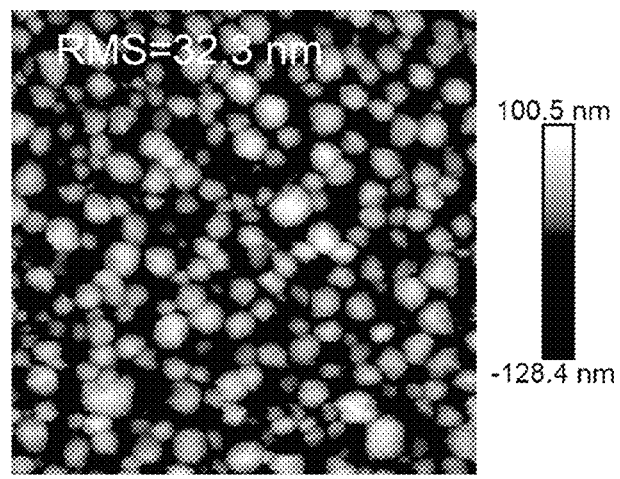
FIG. 4 illustrates an atomic force microscope diagram of a perovskite film in an embodiment 2 of the disclosure.

FIG. 3 illustrates an atomic force microscope diagram of the perovskite film prepared in embodiment 1 of the disclosure, and FIG. 4 illustrates an atomic force microscope diagram of the perovskite film in embodiment 2 of the disclosure. It can be seen that the perovskite film based on SEM-HCl additive has a relatively flat surface appearance and lower surface roughness.

Figure 5:
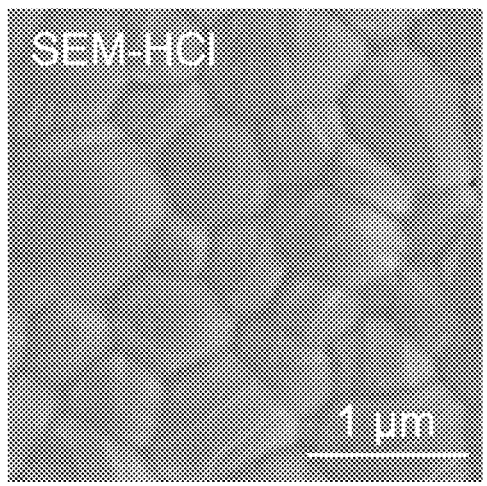
FIG. 5 illustrates a scanning electron microscope diagram of the perovskite film in the embodiment 1 of the disclosure.
Figure 6:
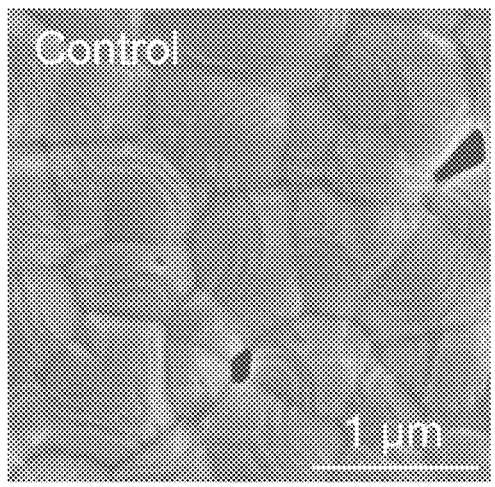
FIG. 6 illustrates a scanning electron microscope diagram of the perovskite film in the embodiment 2 of the disclosure.

FIG. 5 illustrates a scanning electron microscope diagram of the perovskite thin film prepared in embodiment 1 of the disclosure, and FIG. 6 illustrates a scanning electron microscope diagram of the perovskite thin film prepared in embodiment 2 of the disclosure. It can be seen that the perovskite film prepared based on a perovskite crystallization regulation strategy of the disclosure has fewer pinholes and defect states between crystalline grains.

Figure 7:
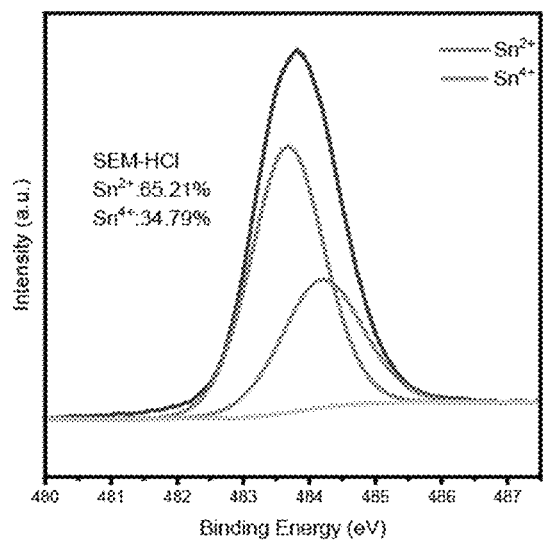
FIG. 7 illustrates an x-ray photoelectron spectroscopy diagram of the perovskite film in the embodiment 1 of the disclosure.
Figure 8:
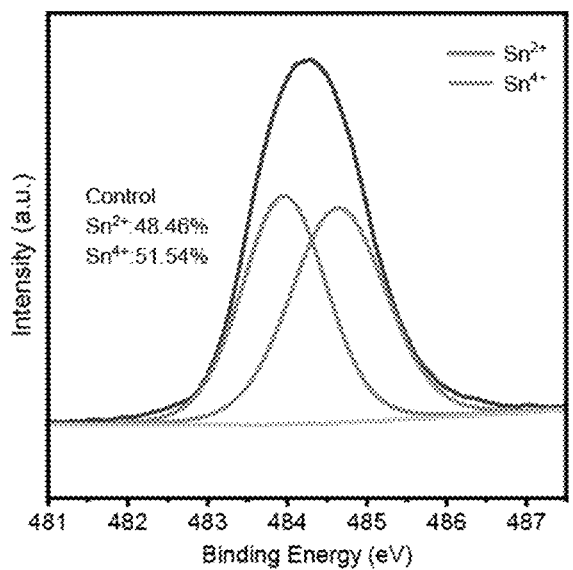
FIG. 8 illustrates an x-ray photoelectron spectroscopy diagram of the perovskite film in the embodiment 2 of the disclosure.

FIGS. 7 and 8 respectively illustrate characterization analysis of Tin (Sn) element composition in embodiment 1 and embodiment 2 of the disclosure. It can be seen that divalent tin ion ($Sn^{2+}$)/tetravalent tin ion ($Sn^{4+}$) of the perovskite film thin film of the embodiment 1 is 1.86, which has significantly improvement compared to 0.94 of the embodiment 2, it shows that oxidation of $Sn^{2+}$ in the photoactive layer film is effectively suppressed, and stability of the prepared photovoltaic device is effectively improved.

Figure 9:
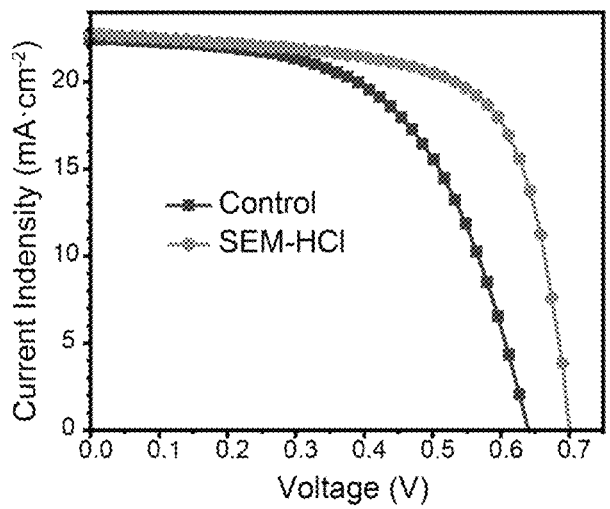
FIG. 9 illustrates a current density-voltage (J-V) curve diagram of the photovoltaic device prepared in the embodiment 1 and a photovoltaic device prepared in the embodiment 2 of the disclosure.

FIG. 9 illustrates a comparative diagram of performances of the photovoltaic devices prepared in embodiment 1 and embodiment 2 of the disclosure. It can be seen that for the photovoltaic device prepared in the embodiment 1, an open circuit voltage ($V_{OC}$) is 0.70 volts (V), a short circuit current density ($J_{SC}$) is 22.80 milliamperes per square centimeter ($mA/cm^2$), a fill factor (FF) is 67.97 percent (%), and a photoelectric conversion efficiency (PCE) is 10.85%. For the photovoltaic device of the embodiment 2, an open circuit voltage is 0.64 V, a short circuit current density is 22.46 $mA/cm^2$, a fill factor is 56.76%, and a photoelectric conversion efficiency is 7.17%.

The photovoltaic device prepared in the embodiment 1 is compared to the photovoltaic device prepared in the embodiment 2, the PCE is significantly improved.

Figure 10:
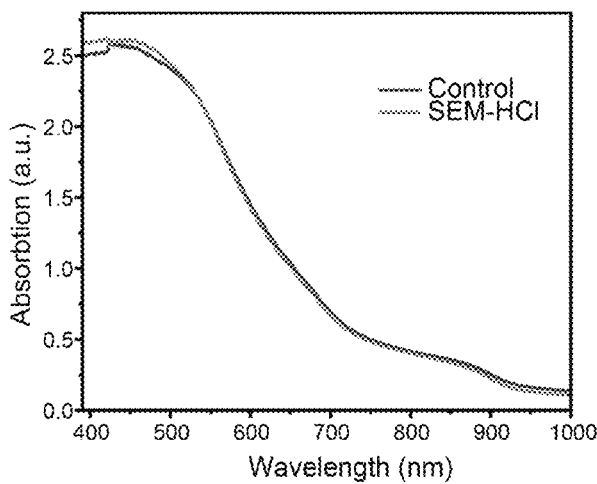
FIG. 10 illustrates a comparative curve diagram of absorbances of the perovskite film in the embodiment 1 and the perovskite film in the embodiment 2 of the disclosure.
Figure 11:
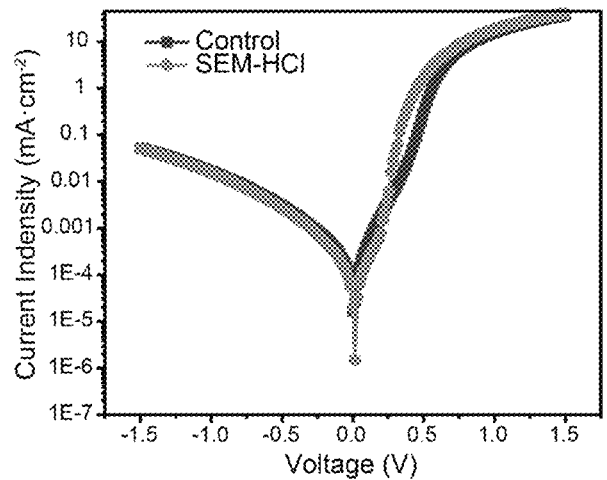
FIG. 11 illustrates a comparative curve diagram of dark currents of the photovoltaic device prepared in the embodiment 1 and the photovoltaic device prepared in the embodiment 2 of the disclosure.

FIG. 10 illustrates a characterization result diagram of the photovoltaic device prepared in the embodiment 1 and the embodiment 2 of the disclosure by using an ultraviolet visible spectrophotometry. It can be seen that the photovoltaic device of the embodiment 1 is compared to the photovoltaic device of the embodiment 2, an introduction of the multifunctional dopant SEM-HCl does not affect an absorbance of the perovskite thin film, nor does it affect a number of photo generated charge carriers generated by the perovskite film. From FIG. 11, it can be seen that the photovoltaic device of the embodiment 1 has a lower leakage current compared to the photovoltaic device of the embodiment 2, and it indicates that an interface contact property of the photovoltaic device of the embodiment 1 has been improved, which is conducive to a long-distance transmission of charge carriers.

Embodiment 3

In order to verify the beneficial effects of the disclosure, the embodiment 3 provides photovoltaic devices including perovskite films with other doping concentration of SEM-HCl, the photovoltaic devices prepared in the embodiment 3 are compared to the photovoltaic devices prepared in the embodiment 1 and the embodiment 2, experimental results are compared through scientific argumentation to verify a true effect of the method of the embodiment 1.

Differences between the embodiment 3 and the embodiment 1 are that in step S3, when preparing a photoactive layer based on SEM-HCl additive, 4 μL of the SEM-HCl solution is added into 200 μL of the perovskite precursor solution to prepare a perovskite solution with a concentration of 1 mol %, and 20 μL of the SEM-HCl solution is added into 200 μL of the perovskite precursor solution to prepare a perovskite solution with a concentration of 5 mol %, and the prepared tin-based perovskite thin films are obtained after stirring the above perovskite solutions for 2 h.

Other steps and preparation process are the same as that of the embodiment 1.

Compared the photoelectric conversion efficiencies and various related parameters of the photovoltaic devices prepared in the embodiment 3 to those of the embodiment 1 and the embodiment 2, results are shown in Table 2.

TABLE 2

A comparison table of performance of the photovoltaic devices including the perovskite films based on different concentrations of SEM-HCl additive

| SEM-HCl | $V_{OC}$/V | $J_{SC}$/ ($mA \cdot CM^{-2}$) | FF (%) | PCE (%) |
|---|---|---|---|---|
| w/o | 0.64 | 22.46 | 56.76 | 8.17 |
| 1 mol % | 0.65 | 22.77 | 57.02 | 8.43 |
| 3 mol % | 0.70 | 22.80 | 67.97 | 10.85 |
| 5 mol % | 0.69 | 22.21 | 64.63 | 9.87 |

The comparison of the PCE of the photovoltaic devices prepared by tin-based perovskite precursor solutions with different doping concentrations shows that a doping concentration of 3 mol % is an optimal doping concentration in the disclosure, and a maximum optimal effect can be obtained.

Embodiment 4

Refer to Table 3, in order to verify the beneficial effects of the disclosure, the embodiment 4 provides photovoltaic devices obtained by preparing perovskite films with the same doping concentration at different periods of the annealing treatment, and the photovoltaic devices prepared in the embodiment 4 are compared to the photovoltaic device prepared in the embodiment 1, experimental results are compared through scientific argumentation to verify a true effect of the method of the embodiment 1.

Differences between the embodiment 4 and the embodiment 1 are as follows.

The period of the annealing treatment for preparing the perovskite film in step S3 is adjusted to 5, 10, and 15 min, respectively: that is, the first transport layers are placed on the hot stage with a temperature of 70° C. to respectively perform the annealing treatment for 5, 10, and 15 min, to thereby obtain the perovskite films.

Other steps and preparation process are the same as that of the embodiment 1.

Compared performances of the photovoltaic devices prepared in the embodiment 4 to performances of the photovoltaic device prepared in the embodiment 1, results are shown in Table 3.

TABLE 3

A comparison table of performances of the photovoltaic devices including the perovskite films prepared at different periods of annealing treatment

| Annealing/min | $V_{OC}$/V | $J_{SC}$/(mA·CM$^{-2}$) | FF (%) | PCE (%) |
|---|---|---|---|---|
| 5 | 0.61 | 14.68 | 18.63 | 1.67 |
| 10 | 0.70 | 22.80 | 67.97 | 10.58 |
| 15 | 0.68 | 21.04 | 55.96 | 8.04 |

As shown in Table 3, the comparison of the PCE of the photovoltaic devices prepared with different periods of the annealing treatment shows that the period of the annealing treatment of 10 min is an optimized reaction period of the disclosure, and the maximum optimal effect can be obtained.

Embodiment 5

Refer to Table 4, in order to verify the beneficial effects of the disclosure, the embodiment 5 provides photovoltaic devices obtained by preparing perovskite films with the same doping concentration at different temperatures of the annealing treatment, and the photovoltaic devices prepared in the embodiment 5 are compared to the photovoltaic device prepared in the embodiment 1, experimental results are compared through scientific argumentation to verify a true effect of the method of the embodiment 1.

Differences between the embodiment 5 and the embodiment 1 are as follows.

The temperatures of the annealing treatment for preparing the perovskite films are adjusted to 60, 70, and 80° C., respectively, that is, the first transport layers are respectively placed on the hot stage with temperatures of 60, 70, and 80° C. to perform the annealing treatment for 10 min, to thereby obtain the perovskite films.

Other steps and preparation process are the same as that of the embodiment 1.

Compared performances of the photovoltaic devices prepared in the embodiment 5 to performances of the photovoltaic device prepared in the embodiment 1, results are shown in Table 4.

TABLE 4

A comparison table of performances of the photovoltaic devices including the perovskite films prepared at different temperatures of annealing treatment

| Annealing/° C. | $V_{OC}$/V | $J_{SC}$/(mA·CM$^{-2}$) | FF (%) | PCE (%) |
|---|---|---|---|---|
| 60 | 0.69 | 21.70 | 64.33 | 9.72 |
| 70 | 0.70 | 22.80 | 67.97 | 10.85 |
| 80 | 0.71 | 22.78 | 65.31 | 10.63 |

As shown in Table 4, the comparison of the PCE of the photovoltaic devices prepared with different temperatures of the annealing treatment shows that the temperature of the annealing treatment of 70° C. is an optimized reaction temperature of the disclosure, and the maximum optimal effect can be obtained.

In conclusion, the disclosure proposes a doped material with a strong coordination effect, and the doped material utilized the strong coordination effect between special groups in SEM-HCl and $Sn^{2+}$ in the tin-based perovskite to achieve functions of passivating a surface defect of the perovskite film, reducing the oxidation of $Sn^{2+}$, and optimizing a crystallization kinetic of the perovskite thin film. The disclosure is compared to the related art, a defect state density of perovskite film crystal prepared in the disclosure is reduced, an extraction and transmission capacity of carriers is improved, a non-radiative recombination of an interface is suppressed, and the PCE and photovoltaic device stability are significantly improved.

It should be noted that the above embodiments are merely used to describe technical solutions of the disclosure, not limited to them, although the disclosure has been described in detail with reference to preferred embodiments, it should be understood by those skilled in the art that the technical solutions of the disclosure can be modified or replaced by equivalents without departing from a spirit and scope of the technical solutions of the disclosure, which should be included in a scope of claims of the disclosure.

What is claimed is:

1. A preparation method of a perovskite film based on semicarbazide hydrochloride (SEM-HCl) additive, comprising:
spin coating a perovskite solution with a doping concentration of 3 moles percent (mol %) of SEM-HCl on a hole transport layer, and adding an anti-solvent dropwise during the spin coating to obtain a film, placing the film on a hot stage with a temperature of 70 degree Celsius (° C.), and performing an annealing treatment on the film for 10 minutes (min) to obtain the perovskite film; and
wherein the perovskite solution is a mixed solution of a SEM-HCl solution and a tin-based perovskite precursor solution, the tin-based perovskite precursor solution is a mixed solution of perovskite materials dissolved in a mixed solution of N, N-dimethylformamide and dimethyl sulfoxide, and the perovskite materials comprise tin iodide (SnI$_2$), formamidinium iodide (FAI), methylammonium iodide (MAI) and tin fluoride (SnF$_2$).

2. A preparation method of a photovoltaic device comprising the perovskite film based on SEM-HCl additive as claimed in claim 1, comprising: preparing a first electrode layer on a substrate layer, preparing a first transport layer on the first electrode layer, preparing a photoactive layer based on SEM-HCl additive on the first transport layer by using an annealing process, preparing a second transport layer on the photoactive layer, preparing a barrier layer on the second transport layer and preparing a second electrode layer on the barrier layer;

wherein the first electrode layer is a metal oxide anode layer, the first transport layer is a hole transport layer, the photoactive layer is the perovskite film, the second transport layer is an electron transport layer, the barrier layer is a hole barrier layer, and the second electrode layer is a metal cathode layer; and wherein the annealing process comprises: placing the first transport layer on a hot stage with a temperature of 70° C., and performing an annealing treatment on the first transport layer for 10 min.

\* \* \* \* \*